United States Patent [19]

Brosh et al.

[11] Patent Number: 4,580,478

[45] Date of Patent: Apr. 8, 1986

[54] MUSICAL KEYBOARD USING PLANAR COIL ARRAYS

[75] Inventors: Amnon Brosh, Montvale, N.J.; David Fiori, Jr., Yardley, Pa.

[73] Assignee: Bitronics, Inc., Montvale, N.J.

[21] Appl. No.: 577,161

[22] Filed: Feb. 6, 1984

[51] Int. Cl.[4] .............................................. G10H 1/34
[52] U.S. Cl. ..................................... 84/1.1; 84/1.27; 84/DIG. 7
[58] Field of Search ..................... 84/1.09, 1.1, 1.15, 84/1.27, DIG. 7

[56] References Cited

U.S. PATENT DOCUMENTS

| | | | |
|---|---|---|---|
| 3,580,979 | 5/1971 | Amano | 84/1.1 |
| 3,634,594 | 1/1972 | Hiyama | 84/1.1 |
| 4,273,017 | 6/1981 | Dodds et al. | 84/1.1 |
| 4,299,153 | 11/1981 | Hoskinson et al. | 84/1.1 |
| 4,357,850 | 11/1982 | Franz et al. | 84/DIG. 11 |
| 4,425,511 | 1/1984 | Brosh . | |

*Primary Examiner*—Stanley J. Witkowski
*Attorney, Agent, or Firm*—Arthur L. Plevy

[57] ABSTRACT

There is disclosed a key which is particularly adapted for use in a musical keyboard. The key includes a top pivotable member which acts as a key surface and which is pivoted to move with respect to a reference plane. The key contains on a bottom surface a magnetic field effecting member. Located beneath the key on the reference plane is a rigid board containing a planar coil configuration. As the hinge member is moved towards the rigid board, the member affects the magnetic field of the planar coil configuration to vary the inductance as well as the magnetic coupling in other arrangements. A plurality of such keys are employed as the keys in a musical keyboard and are associated with frequency determining circuits such as oscillators to provide output frequencies necessary for the control of music. The planar coil configuration, in conjunction with the member of the movable board, operates as a position sensor to enable a manufacturer to provide many functions necessary for operation in an electronic musical instrument.

19 Claims, 15 Drawing Figures

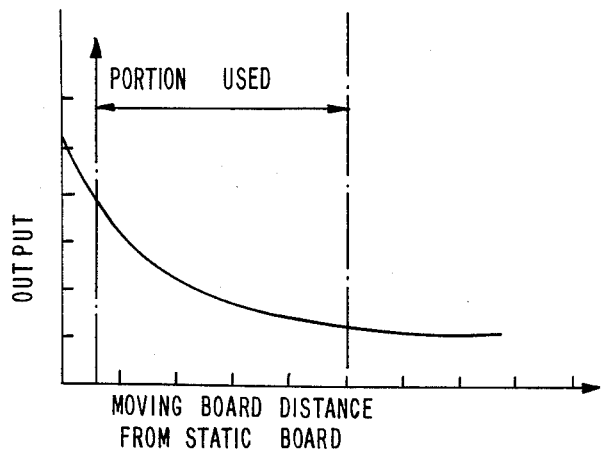
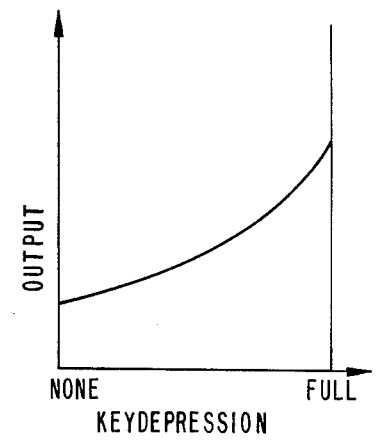
FIG. 3A
FIG. 3B
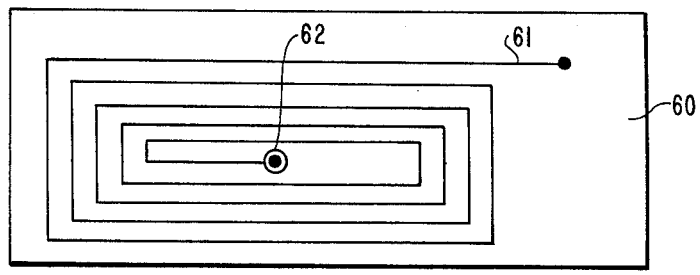
FIG. 4
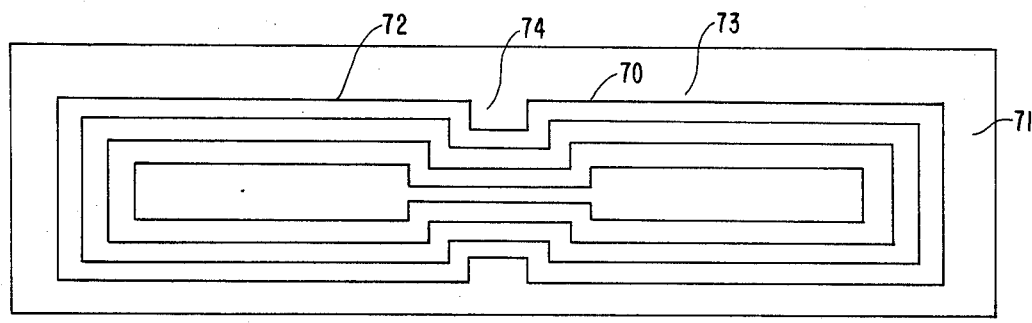
FIG. 5A
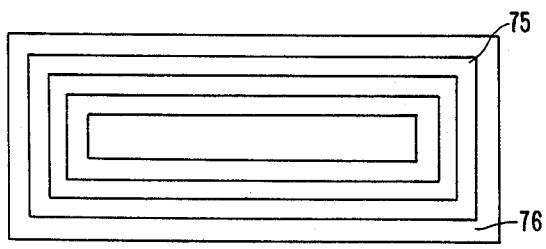
FIG. 5B
FIG. 5C

MUSICAL KEYBOARD USING PLANAR COIL ARRAYS

BACKGROUND OF THE INVENTION

This invention relates to a musical keyboard for utilization in an electronic musical instrument.

Many musical instruments employ a keyboard. As is known, these instruments consist of electronic organs, pianos and more particularly the electronic musical synthesizer. The prior art is cognizant of such keyboards utilized for musical instruments.

In regard to such keyboards, there are different requirements necessary in order to provide the user with certain features which are necessary and important to the generation and control of music. For example, in a musical keyboard touch or velocity control is important. This is important as the musician may wish to rapidly strike a key to develop a certain sound or gently press the same key for other musical effects. Other parameters such as after touch or key pressure control are also important functions which desirably should be implemented in such a keyboard. Such characteristics should be provided in a reliable, versatile and cost effective means.

The particular musical keyboard to be described utilizes planar coil sensor arrays which coils are printed on suitable substrates and which operate with electronic circuitry for deriving an electrical output as a function of the position of the key. In this manner the keyboard contains keys which are totally noncontacting and, therefore, extremely reliable as there are no mechanical parts which can wear or deform. In implementing such a keyboard for a musical instrument, one desires an electrical output from the sensor array which varies as a continuous function of key depression. In this manner, the output can be used to provide a touch sensitive musical keyboard where the musician can cause certain musical parameters according to the control of each key. For example, as previously indicated above, by controlling the key, the sound emanating in regard to intensity or pitch should be modulated according to the manner in which the musician moves or depresses each key. In any event, other instruments such as an organ sometimes have only a single switching point per key, and as will be explained, the apparatus according to this invention can also be made to trigger or activate an electronic switch at a predetermined key position.

BRIEF DESCRIPTION OF THE PREFERRED EMBODIMENT

A key apparatus for use in a musical keyboard array, comprising, a pivotable planar key member having a first end pivotally mounted on a reference plane and a second movable end, and having positioned on a surface thereof a member capable of effecting a magnetic field, a second planar member rigidly positioned on said reference plane and underlying said member capable of effecting said magnetic field and having positioned on the surface facing said surface of said key member a planar coil configuration having an inductance whereby when said member is moved into proximity to said planar coil configuration the inductance of said planar coil configuration is varied and means coupled to said planar coil configuration to provide an output indicative of the proximity of said means in relation to said rigid board to thereby provide said output according to the movement of said key member with respect to said second planar member.

BRIEF DESCRIPTION OF THE FIGURES

FIG. 3A is a diagram showing output versus distance between a moving and stationary board.

FIG. 3B is a diagram showing output versus key depression according to this invention.

FIG. 4 is a top plan view of one type of planar coil used in this invention.

FIG. 5A is a top plan view of a shorted coil employed in this invention on a movable board.

FIG. 5B is a plan view of another planar shorted coil.

FIG. 5C is a top plan view of a metallic member which can replace a shorted coil.

DETAILED DESCRIPTION OF THE FIGURES

Figure 1:
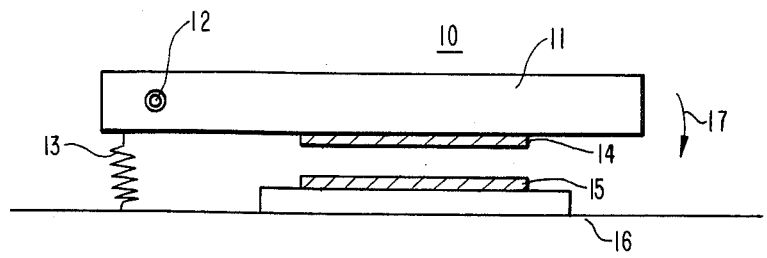
FIG. 1 is a simple mechanical diagram showing a key utilizing planar coil sensors according to this invention.

Referring to FIG. 1, there is shown a simple schematic diagram of a basic key construction 10 according to this invention.

A musical key normally consists of a top member 11 which is linked to a hinge 12 on one side and loaded by a spring 13 at the hinge end. A moving sensor board 14 is mounted on the underside of the key member 11, while a static sensor board 15 is mounted underneath the key on a fixed surface 16. Each board as 14 and 15, as will be explained, contains a compatible coil arrangement which, for example, is a planar coil. The particular coil arrangement which is utilized in conjunction with this invention has been fully described in U.S. Pat. No. 4,425,511 entitled PLANAR COIL APPARATUS EMPLOYING A STATIONARY AND MOVABLE BOARD, issued on Jan. 10, 1984 to Amnon Brosh, the inventor herein.

As the key number 11 is depressed, the board 14 which moves in the direction of arrow 17 moves closer to the static board or stationary board 15 providing a continuous output signal as will be described.

Figure 2A:
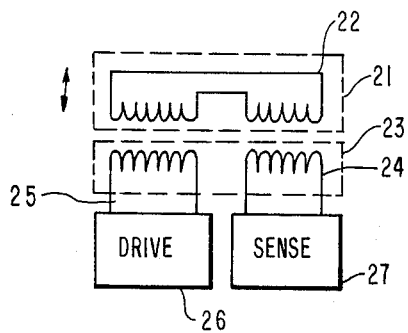
FIGS. 2A to 2D are schematic diagrams showing different electrical circuits which can be provided by the sensor arrangement shown in FIG. 1.

Referring to FIG. 2A, there is shown one particular configuration in schematic form showing a coil arrangement which can be employed in the mechanism depicted in FIG. 1.

The moving coil which is analogous to coil 14 of FIG. 1 consists of a shorted coil arrangement. The static coil as 15 of FIG. 1 consists of a first coil 25 designated as a drive coil which is positioned adjacent to a second coil 24 designated as a sense coil. The drive coil 25 is energized by means of a suitable source 26 such as a square or sinewave generator. The sense coil 24 is associated with sutiable sensing circuitry as will be explained.

The circuitry is responsive to the magnitude of signal coupled between the drive and sense coils as the moving coil 22 moves closer to the coils 24 and 25.

As shown in FIG. 2A, the shorted coil 22 on the movable board 21 causes the coupling between the drive coil 25 and the sense coil 24, which are both located on the static board 23, to vary as a function of the distance of the moving board 21 from the static board 23. This, therefore, provides an output from the sensing circuitry 27 which exhibits a varying amplitude signal for movement.

Figure 2B:
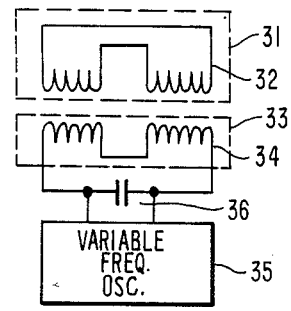

Referring to FIG. 2B, there is shown another arrangement. In FIG. 2B a shorted coil 32 is again employed on the moving board 31. The static board 33 contains a differential coil configuration where the coils are associated with a capacitor 36 and form with the capacitor the tuned or tank circuit of an oscillator 35. As the board 31 moves closely to the static board 33, the frequency of the oscillator is modulated. Essentially, in this configuration, as the moving board 31 is moved closer to the static board 33, the shorted coil 32 operates to change the inductance of the coils 34 which, therefore, varies the frequency of the oscillator.

Figure 2C:
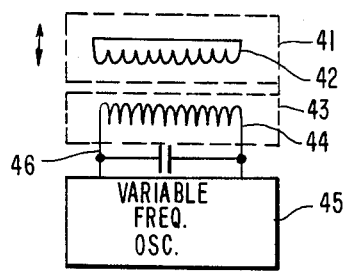

Referring to FIG. 2C, there is shown a single coil arrangement where a shorted coil 42 is positioned on a moving board 41. Located on a static board 43 is a coil 44 which is associated with a capacitor 46. The coil 44 and capacitor 46 form the tuned circuit for a variable frequency oscillator 45. In this arrangement as the moving board is moved closer to the static board 43, both the frequency and the amplitude of the signal in the oscillator 45 is changed. In this configuration the shorting coil 42 operates to vary the inductance and the Q of coil 44 on the static board 43 to thereby change both the frequency and amplitude of the output signal emanating from the variable frequency oscillator 45.

Figure 2D:
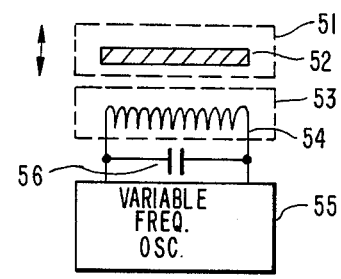

As shown in FIG. 2D, in lieu of a shorted coil as coil 41, one may also employ a solid conducting board 52 mounted on the movable key member 51. The board 52 may be fabricated from aluminum, copper and so on. When moved in the proximity of coil 54 associated with capacitor 56, it will again vary the inductance and the Q of the tuned circuit and hence cause the variable frequency oscillator 55 to provide an output which varies both in frequency and amplitude. It is noted that there are many examples of suitable oscillator circuits which can be employed in conjunction with the above noted coils in order to obtain the type of signal outputs as described above.

Some examples of suitable oscillator circuits will be given.

Referring to FIG. 3A, there is shown a graph or plot of the output signal from, for example, the sensing circuit or from the oscillator versus the distance of the moving board from the static board.

In FIG. 3B, there is shown a plot of the output versus the key depression when the key depression causes the moving board to move toward the static board.

In FIG. 3B the output versus the key depression exhibits a quasi-logarithmic shape which is a highly desirable feature in musical instruments. In the operation of such circuits the sensor which is the coil configuration is most sensitive when the key is fully depressed or when the moving board is in closest proximity to the static board. This feature makes it possible to provide the musician with an after touch control per key. This refers to applying variable pressure when the key is fully depressed after the initial attack so as to further cause a modulation of the sound.

As shown in FIGS. 2A to 2D, the sensors described are essentially planar coil configurations which, as indicated, are also shown and described in the above noted patent.

Referring to FIG. 4, there is shown a typical planar coil configuration for use in position sensing in a musical keyboard. The coil is printed on a substrate 60 with a start point or first terminal 61 and an ending point or second terminal 62. The coil as seen follows a rectangular pattern. The end terminal 62 is contiguous with a terminal pad so that the terminal can be connected to an appropriate terminal of an oscillator via a suitable wire or terminal 62 could be a plated-through hole on board 60 which would enable the terminal of the coil to be connected to a similar point on the otherside of the board 60 which may also contain an additional coil. The turns orientation on both sides of the board 60 are designed to form a coil arrangement which provides an magnetic field of the same polarity.

Referring to FIG. 5A, there is shown a shorted coil 70 which can be used as coils 23 and 32 and shown in FIGS. 2A to 2B. The coil arrangement is again depicted on a planar substrate 71 and consists of a first rectangular section 72 which is connected to a second rectangular section 73 within a central area 74. As can be seen from FIG. 5A, the portions 72 and 73 occupy a greater area than the central portion 74 which is the connecting portion between sections 72 and 73. The pattern as shown in FIG. 5A essentially is of a rectangular type pattern where the edges of each coil are sharp.

Referring to FIG. 5B, there is shown a shorting coil 75 arranged on a substrate 76 and which can be employed as coil 42 as shown in FIG. 2C. FIG. 5C depicts a solid conductive plate 80 which can be used as plate 52 as depicted in FIG. 2D. In regard to the above, the coils as shown in FIGS. 4 and 5 are planar and are deposited on suitable substrates by means of printed circuit techniques which include photolithography and batch processing techniques. In this manner the coils as shown in FIGS. 4 and 5 can be printed in a rapid and efficient manner. Thus the coils provided are extremely low cost while being reliable and rugged.

Musical keyboard instruments as is well known employ multiple keys. The number of keys can vary as a function of the particular instrument. For example, in a simple organ there may be only a few keys such as 10 to several hundred keys as found in a church organ. Musical synthesizers and pianos employ on the average between 40 to 90 keys. It is, therefore, important that the larger arrays of planar coil sensors in the static board should lend themselves to accurate and reliable operation while maintaining low cost fabrication. Since one employs photolithography in the printing of such coils, the coil-to-coil spacing and uniformity is essentially guaranteed without excessive effort or cost. This is inherent in the process which is a widely used and highly repeatable process. In addition all of the common interconnections between the coils and the associated electronic circuitry are accomplished at no extra cost. In general the keyboard can be operated with each individual key having its own drive and sense circuitry as according to the arrangement shown in FIG. 2A. In a similar manner each key may be associated with its own oscillator as shown in FIGS. 2B to 2D. As will be further explained, it may be desirable to reduce the number of components and associated circuitry and hence one may employ a multiplexer arrangement whereby the various tuned circuits associated with the keys are shared while multiplexed with a common electronic circuit such as a common drive or sense circuit or a central oscillator.

In utilizing a common circuit, coil arrays of the printed planar type tend to create certain nonuniformity problems when connected to one central location. This is due to the length of the leads directed from the planar coils to the central location which vary in length from coil to coil. To overcome this problem, the technique for equalizing the lead length is utilized.

Figure 6:
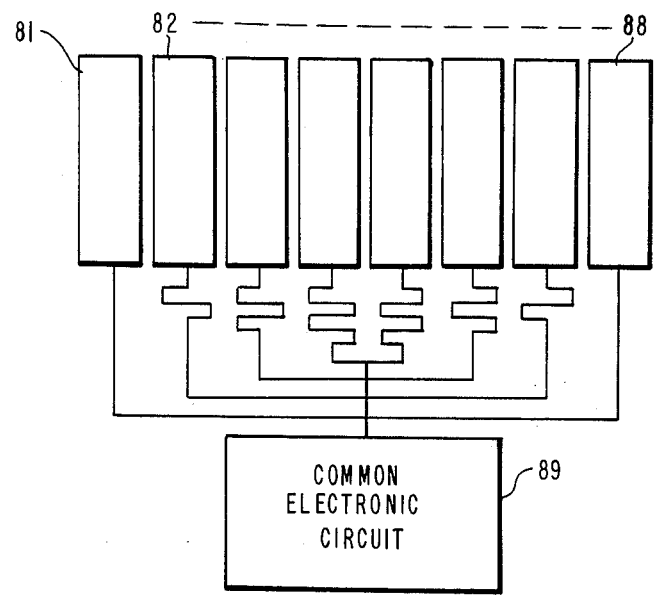
FIG. 6 is a schematic diagram showing a keyboard array coupled to a common circuit.

Referring to FIG. 6, there is shown an array of planar coils which are positioned in a row as 81 to 88. The positioning of these coils in this manner is similar to a typical musical keyboard format. The common electronic circuit 89 is located centrally with respect to the coil array. Each coil is now connected separately to the common electronic circuit using meandering lines so that the length of lead from each coil to the electronic circuit are all equal. By using this technique, the coil-to-coil uniformity is maintained since their inductances and stray capacitance are kept equal. The use of the meandering lines helps to reduce the amount of adjustments required to guarantee uniform key action. Depending on the degree of required key-to-key uniformity, certain adjustments may have to be incorporated in keyboards employing planar coil position sensors.

The adjustments can be mechanical in nature or they can be incorporated in the software of a microprocessor employed in conjunction with musical instruments.

Figure 7:
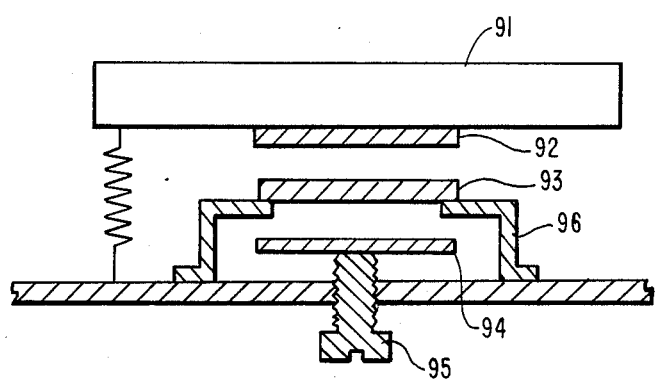
FIG. 7 is a mechanical diagram showing an adjustable output key according to this invention.

Referring to FIG. 7, there is shown a typical mechanical control which may be employed to obtain key-to-key uniformity. The arrangement of the key is similar to the one shown in FIG. 1 and hence the movable member consists of a hinge lever 81 which contains on the undersurface a moving board 92. Also shown is a static board 93 which is mounted between two legs as 96. A movable adjustment board 94 is shown connected to a screw 95. The board 94 can be moved towards or away from the static board 93 by means of the screw adjustment 95. The adjustment board 94 has the same effect on the static board sense coils as does the moving board and as explained above. Therefore, the position of the board 94 will influence and alter the effect of the moving board 92 on the static board 93. To illustrate this principle, consider a high quality organ using planar coils as nonconducting switches. Basically, the output of each key is compared to a preset value and when the value is reached, the circuit triggers a switch. It is extremely important in a high quality organ to have all the keys trigger at exactly the same point of depression. To achieve this, the arrangement shown in FIG. 7 is employed. To adjust the keyboard, all of the keys are pressed to the desired triggering point. Now the adjustment boards as board 94 of each key are moved in or away from the static board 93 until triggering occurs. In this manner, all keys will now trigger at the same point of key depression. This same arrangement may also be used to equalize the performance of the keys in a proportional musical keyboard such as a touch sensitive keyboard.

The software based adjustment as indicated above can can be obtained in two degrees of sophistication. The simplest method is a null or key-at-rest position adjustment. Upon turning the power of the musical instrument on, an initial scan of the keys will provide their null or at-rest output. This information is fed into a memory and used to perform corrections for data obtained from subsequent key scannings when the instrument is being played. A more elaborate scheme combines this rest position adjustment with an initial full scale or key fully depressed calibration. Such a calibration is performed on the instrument at the factory and the values for all keys are applied permanently to a PROM. A sample algorithm may then be employed which uses the information available for each key in its rest position and in its fully depressed position in order to perform corrections on all points in between. This procedure results in an extremely accurate touch sensitive keyboard. Since the sensing is performed by nontouching devices, there is no cause for the adjustments to go out of calibration due to causes such as those found in mechanical switchboards where the switches may wear or become deformed due to excessive force or rough handling. Another advantage of the planar keyboard is that the sensor coils having only a few turns have a very low impedance and are, therefore, not effected to any great degree by dirt, dust, contamination or even liquid spills. This makes the planar coil keyboard ideally suited for portable instruments which are transported or used on the road and so on.

Figure 8:
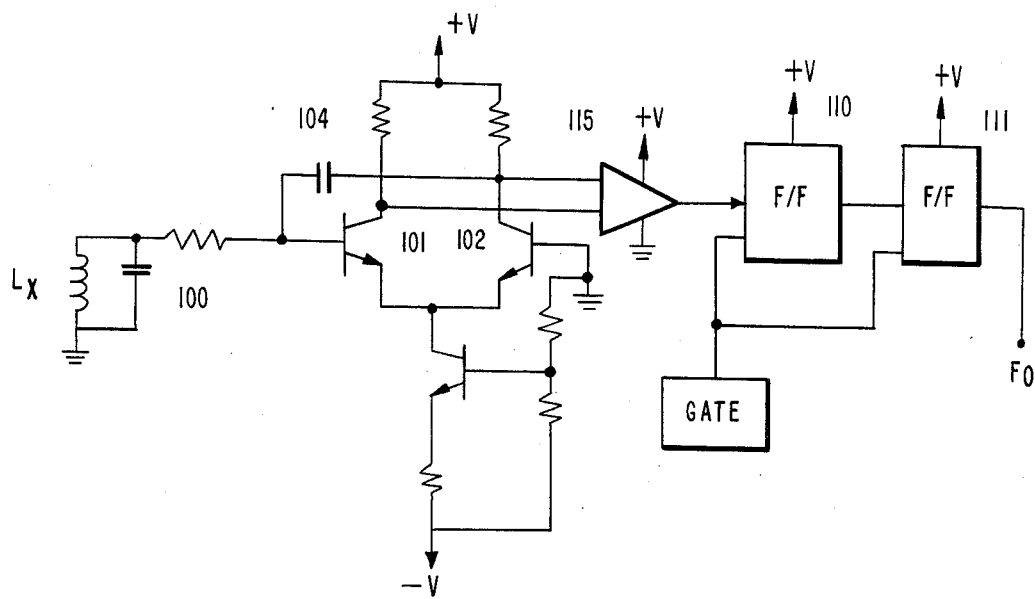
FIG. 8 is a simple electrical schematic depicting an oscillator and divider configuration which can be employed with the planar coil sensors.

Referring to FIG. 8, there is shown an oscillator circuit which may be employed as the oscillator circuits depicted in FIGS. 2B to 2D. Essentially, the coil which is analogous to the static coils as shown in those figures is designated a $L_x$ and is shunted by a suitable capacitor 100. The circuit is connected to the base electrode of a first transistor 101 arranged in a differential amplifier circuit with transistor 102 and including a current source transistor 103. Positive feedback is afforded by means of capacitor 104 to form an oscillator circuit where the frequency of oscillation is determined essentially by the inductance $L_x$ and capacitor 100. The output from the collector electrodes of transistor 101 and transistor 102 are directed to a comparator circuit 105. The comparator limits the output signal to provide at its output a square wave signal. The output may then be directed to a frequency divider consisting of flip/flops or bistable multivibrators 110 and 111. The multivibrator may be clocked by a suitable Gate and will provide at an output the oscillator frequency which is divided by a factor according to the number of stages in the prescaler or the output may be routed directly to a counter. As indicated, since the inductance of the planar coil is relatively low, the output frequency of the oscillator is high and hence the prescaler is employed to divide this frequency to any frequency desired.

The entire circuit as depicted above can be implemented by using commercially available integrated circuit components.

Figure 9:
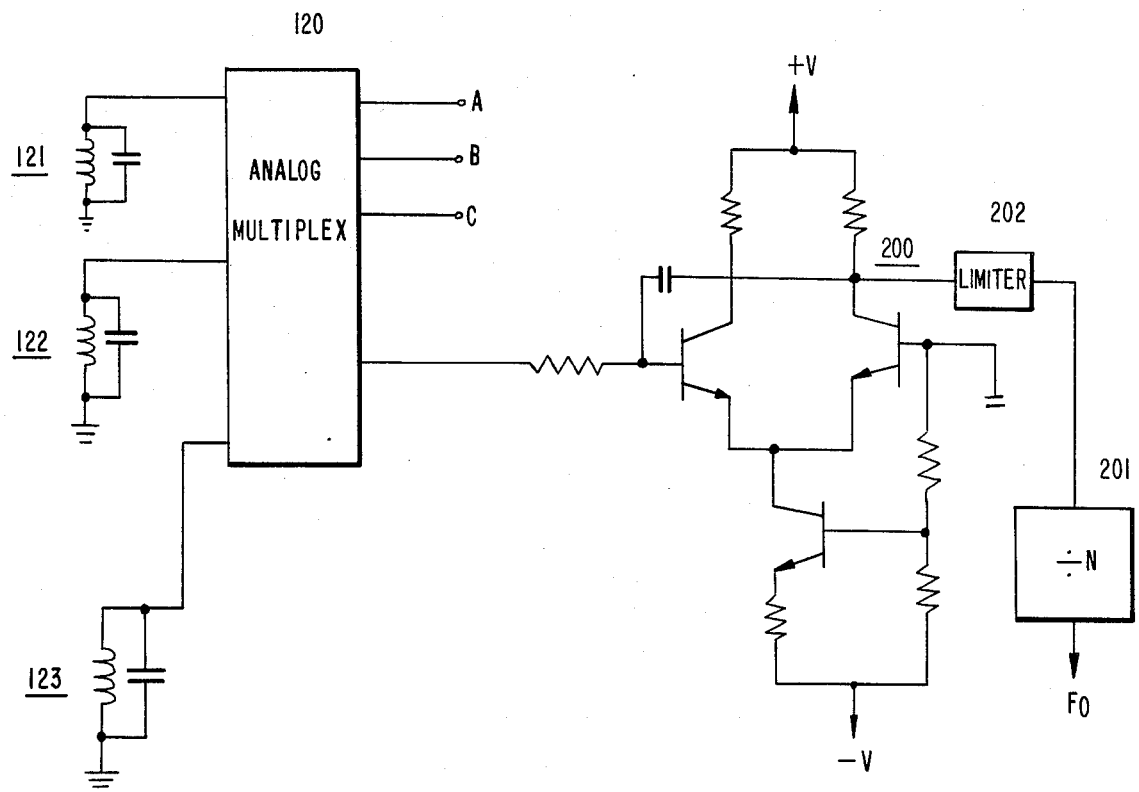
FIG. 9 is a simple schematic showing a multiplexer circuit which can be used to couple a plurality of coils to a common oscillator circuit.

Referring to FIG. 9, there is shown a multiplexer 120 which is a conventional integrated circuit available from most commercial manufacturers. The inputs to the multiplexer are directed to the tuned circuits as 121 to 123 which are associated with the planar coil configurations as described above. The multiplexer contains a series of inputs designated as A, B, C, which are coupled to a scanner or decoding Gates to enable each of the tuned circuits which are coupled to the inputs of the multiplexer to be scanned in sequence. The common output of the multiplexer is connected to an oscillator 200 whose output may be connected to a prescaler or divider 201. The output of the divider will provide a frequency according to the frequency of resonance of the associated tuned circuit.

The scheme shown in FIG. 9 is analogous to the circuit shown in FIG. 6, wherein the multiplexer operates to connect each tuned circuit to the common oscillator 200. The output of the oscillator is directed through a limiter which is a commercially available high speed comparator and operates to enable the oscillator to achieve compatibility with industry standard TTL logic. Once the oscillator is rendered in TTL compatibility logic levels, simple and expensive TTL logic can be incorporated to derive any digital data format which may be required.

Apart from the obvious benefits of the above noted systems regarding the noncontacting nature of the sensor as well as the fact that they are economical to provide and reliable is the further advantage that the instrument manufacturers can use the sensors to derive all the proper keyboard control modes. For example as indicated, velocity control can be derived from the electrical output versus key position as shown, for example, in FIG. 3A. In order to implement this technique, one can now derive the rate of change of the position signal to provide a signal which is equivalent to the velocity at which the key is stuck. Another method for deriving the velocity, is establishing two set points on the output versus position curve. The time it takes the key to reach from one set point to the other is inversely proportional to the velocity at which the key is struck. The time elapsed can be derived by counting clock pulses between the two set points or by counting the number of scans in a multiplexed system.

There are many other features which can be implemented by using the above noted sensor arrays. For example, elastic pads can be inserted under the keys so that further depression of the key following the initial attack is obtained by applying pressure to the key to compress the elastic pads. The portion of the electrical output versus the position of the key which corresponds to the motion obtained by the key due to the compression of the elastic pad can be used to drive the key pressure control of the instrument.

It is, therefore, indicated that by use of the above noted sensor arrangements, one can achieve great versatility in implementing musical keyboard functions.

We claim:

1. A key apparatus for use in a musical keyboard array comprising:
    a pivotable planar key member having a first end pivotally mounted on a reference plane and a second movable end, having attached to the surface thereof a member capable of effecting a magnetic field,
    a second planar member rigidly positioned on said reference plane and underlying said member capable of effecting said magnetic field and having positioned on the surface facing said surface of said key member a planar coil configuration having a given inductance and an associated Q whereby when said key member is moved into proximity to said planar coil configuration, the planar coil field is varied, and
    means coupled to said planar coil configuration to provide an output indicative of the proximity of said key member in relation to said second planar member to thereby provide said output according to the movement of said key member with respect to said second planar member, said means including an oscillator circuit coupled to said planar coil configuration and operative to provide an output which varies solely in accordance with the proximity of said key member with respect to said second planar member.

2. The key apparatus according to claim 1, wherein said member capable of effecting a magnetic field comprises a planar coil arrangment having first and second terminals coupled together to form a shorted coil configuration.

3. The key apparatus according to claim 1, wherein said member capable of affecting a magnetic field comprises a planar member fabricated from a conductive material.

4. The key apparatus according to claim 1, further including a capacitor coupled across said planar coil configuration to form a tuned circuit therewith.

5. The key apparatus according to claim 1, further including a frequency divider coupled to the output of said oscillator circuit to provide at an output a divided frequency.

6. The key apparatus according to claim 2, wherein said shorted coil and said planar coils are rectangular coil configurations.

7. The key apparatus according to claim 1, further including biasing means coupled to said key member near said pivotable end to allow said key member to move upon application of a given force to the surface thereof.

8. The key apparatus according to claim 1, wherein said output varies both in frequency and amplitude.

9. A keyboard apparatus for use in a musical instrument, comprising:
    a plurality of key structures arranged in a row, each structure having a planar key member pivotally mounted on a reference plane and capable of moving when depressed towards or away from said plane, each of said key members having secured to a surface thereof a magnetic field effecting member,
    a plurality of static members each associated with one of said key structures and each underlying said associated planar key member, and each having located on a surface thereof a planar coil configuration, whereby when said associated key member is moved towards said associated static member the inductance of said planar coil member is varied, and
    common circuit means coupled to said planar coil configuration with each planar coil configuration coupled to said common circuit means by lines of the same effective length, with said common circuit means operative to provide an output for each of said keys according to the position of the same.

10. The apparatus according to claim 9, wherein said common circuit means includes a multiplexer having a plurality of input terminals with each terminal coupled to a separate one of said planar coil configurations and a common output coupled to an oscillator circuit and means associated with said multiplexer for selecting any one of said inputs for connecting to said common output to access said oscillator to provide an output frequency according to the inductance of said planar coil configuration coupled to said selected input.

11. The apparatus according to claim 9, further including a plurality of capacitors each one associated with one planar coil configuration and in shunt with the same to provide a tuned circuit.

12. The apparatus according to claim 9, wherein said planar coil configuration is a printed coil of a rectangular format.

13. The apparatus according to claim 9, wherein said magnetic field effecting member is a planar shorted coil configuration.

14. The apparatus according to claim 9, wherein said magnetic field effecting member is a conductive planar plate.

15. A key apparatus for use in a musical keyboard comprising:
   a pivotable planar key member having a first end pivotally mounted on a reference plane and second movable end, and having positioned on a surface thereof a first magnetic field effecting member,
   a second planar member rigidly positioned on said reference plane and underlying said first magnetic field effecting member and having positioned on a surface facing said surface of said key member a planar coil configuration having an inductance,
   a third planar member having located on a surface a second magnetic field effecting member and positionally adjustable on said reference plane to move towards or away from said second planar member to thereby adjust said inductance whereby when said key member is moved into proximity with said second planar member, the inductance of said planar coil varies according to the position of both said key member and said third planar member, whereby said third planar member can be positionally adjusted in accordance with a desired inductance change to accurately determine the position of said key member with respect to said second planar member.

16. The key apparatus according to claim 15, wherein said first magnetic field effecting means is a shorted coil.

17. The key apparatus according to claim 15, wherein said second magnetic field effecting means is a shorted coil.

18. The key apparatus according to claim 15, wherein said first magnetic field effecting means is a conductive planar member.

19. The key apparatus according to claim 15, wherein said second magnetic field effecting means is a conductive planar member.

* * * * *